(12) United States Patent
Hall et al.

(10) Patent No.: US 10,277,148 B2
(45) Date of Patent: Apr. 30, 2019

(54) LOW ENERGY ELECTRIC MOTOR BRAKE

(71) Applicants: David R. Hall, Provo, UT (US); Emily Brimhall, Alpine, UT (US); Austin Carlson, Provo, UT (US); Kevin Rees, Herriman, UT (US); Joe Fox, Spanish Fork, UT (US); Seth Myer, Eagle Mtn., UT (US)

(72) Inventors: David R. Hall, Provo, UT (US); Emily Brimhall, Alpine, UT (US); Austin Carlson, Provo, UT (US); Kevin Rees, Herriman, UT (US); Joe Fox, Spanish Fork, UT (US); Seth Myer, Eagle Mtn., UT (US)

(73) Assignee: Hall Labs LLC, Provo, UT (US)

( * ) Notice: Subject to any disclaimer, the term of this patent is extended or adjusted under 35 U.S.C. 154(b) by 0 days.

(21) Appl. No.: 15/626,554

(22) Filed: Jun. 19, 2017

(65) Prior Publication Data

US 2018/0367069 A1 Dec. 20, 2018

(51) Int. Cl.
*H02P 3/12* (2006.01)
*H02P 7/03* (2016.01)
*H03K 17/567* (2006.01)

(52) U.S. Cl.
CPC .................. *H02P 3/12* (2013.01); *H02P 7/05* (2016.02); *H03K 17/567* (2013.01)

(58) Field of Classification Search
CPC ......................................................... H02P 3/12
USPC ......................................................... 318/374
See application file for complete search history.

(56) References Cited

U.S. PATENT DOCUMENTS

2008/0290823 A1* 11/2008 Grehant .................... H02P 1/44
318/3
2011/0248653 A1* 10/2011 Brotto ..................... B25F 5/021
318/139

* cited by examiner

*Primary Examiner* — Erick D Glass (57) ABSTRACT

In various example embodiments, a low energy electric motor brake is described comprising one or more electronic switches that connect the input wires to an electric motor together, thus shorting out the motor and braking the motor. The electronic switches are separate from the control system, and provide the braking function. This alleviates the motor controllers and other system control units from providing the braking function to the motor. The electronic switches require minimal to no power in order to maintain the brake to the motor. The control unit may be placed in a low power or sleep mode while the electronic switches maintain the brake.

20 Claims, 9 Drawing Sheets

LOW ENERGY ELECTRIC MOTOR BRAKE

BACKGROUND

Field of the Invention

This invention generally relates to electric motors and more particularly relates to electrically braking motors.

Background of the Invention

There are a variety of automated window covering systems that utilize electric motors to raise and lower the window covering element. The window covering is used to block light and to provide privacy. In some cases, once the window covering element has been closed, the weight of the blinds may force the electric motor to turn backwards, allowing the blinds to partially open. To prevent this from happening various mechanisms have been employed to stop the motor from turning or otherwise prevent the blinds from relaxing open after they have been closed.

A known method to prevent an electrical motor from turning is to connect the two input wires together, creating a short in the motor and thus preventing the motor shaft from turning. In many cases a controller of some kind is used to connect the two input wires together. This requires the control unit and/or motor controller to be active. There are cases where retaining power to the control unit and/or motor controller consumes more power than is desirable for the system. For example, the system may be a solar powered system that charges batteries to power the system. There may be a limited budget of energy available to keep the control unit and motor controller "on".

A system is needed that uses a low amount of power in order to maintain the braking function of the electric motor. It is also desirable to have a system that maintains the brake during failures within the system that interrupt the power supply. Ideally, the switching device that maintains the brake is autonomously powered.

SUMMARY

This invention has been developed in response to the present state of the art and, in particular, in response to the problems and needs in the art that have not yet been fully solved by currently available systems and methods. Features and advantages of different embodiments of the invention will become more fully apparent from the following description and appended claims, or may be learned by practice of the invention as set forth hereinafter.

Consistent with the foregoing, an electric motor brake apparatus is disclosed. One or more brake switches connect the two input wires of the electric motor together. This creates a brake, locking the motor shaft so that it can not rotate. The brake switches are powered separate from system controllers, requiring little to no power for this operation. By incorporating these brake switches into the system, the amount of power to maintain switch position is minimal. In many cases, the window covering may be closed for a major part of the day, not requiring any power to the system. In the disclosed invention, only the brake switches are active during this time period, requiring little to no power.

The disclosed invention provides energy savings, and also prevents the motor from relaxing in the case of a disruption of power to the control system. It also protects from any failure of the control unit or motor controller, maintaining the brake during these occurrences. For example, a normally closed relay does not require power to maintain the brake. The relay only requires power to open the switch while the motor is operating. Another example is a MOSFET transistor. This device has integrated capacitance that allows it to maintain the required voltage to keep the switch in the closed position. Each time the switch is actuated, the capacitor is recharged.

In certain embodiments, the apparatus includes: a window covering actuation mechanism; a gearbox assembly configured to electromechanically operate the window covering actuation mechanism; the gearbox assembly further including an electric motor with input wires; a control unit with a processor and memory; a motor controller connected to the electric motor and the control unit; a power source connected to the control unit and the motor controller; one or more electronic switches connected to the control unit, the motor controller and the power source; wherein the control unit disconnects the power source to the motor controller and closes the one or more electronic switches, thus connecting the electric motor input wires together which causes the electric motor to brake; and wherein the one or more electronic switches maintains the brake. The electronic switches may be battery powered in the event of a power failure.

In another embodiment, the one or more electronic switches comprise one or more of transistors, relays, FET, MOSFET, IGBT, latching relays, and bistable relays. In an embodiment, the electric motor is a DC motor. In one embodiment, the power source comprises batteries. In another embodiment, the power source comprises capacitors. In certain embodiments, the one or more electronic switches further also include one or more capacitors as a second power source. In an embodiment, the second power source is protected from power drain by the power source by a diode.

In an embodiment, the apparatus further includes roller shades wherein the electric motor raises and lowers the shades. In one embodiment, the apparatus is attached to the end of the roller shades. In another embodiment, the apparatus is inside the roller shades' roller tube. The types of window blinds may be one of the following types: Persian or slat; Venetian; Roman shades; horizontal blinds, and vertical blinds, and window shutters.

In an embodiment, the one or more electronic switches are normally closed relays which do not require power to retain a closed position. In another embodiment, the one or more electronic switches comprise MOSFET transistors further comprising capacitance, thus maintaining a voltage which retains the switches in the closed position. In one embodiment, the one or more electronic switches maintains the brake when the control unit is in a low power mode. In an embodiment, the one or more electronic switches maintains the brake when the motor controller is off. In another embodiment, the one or more electronic switches maintain the last switch position received from the control unit prior to power loss. In an embodiment, the control unit is wirelessly controlled. The electronic switches may be battery powered in the event of a complete power failure.

In a certain embodiment, a motor brake system includes: an electric motor with input wires; a control unit comprising a processor and memory; a motor controller connected to the electric motor and the control unit; a power source connected to the control unit and the motor controller; one or more electronic switches connected to the control unit, the motor controller and the power source; wherein the control unit disconnects the power source to the motor controller and closes the one or more electronic switches, thus connecting the electric motor input wires together which causes the electric motor to brake; and wherein the one or more electronic switches maintains the brake.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION OF THE DRAWINGS

The description that follows includes systems, methods, techniques, instruction sequences, and computing machine program products that embody illustrative embodiments of the disclosure. In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail. In various embodiments, a system as described herein creates an ecosystem.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

Figure 1:
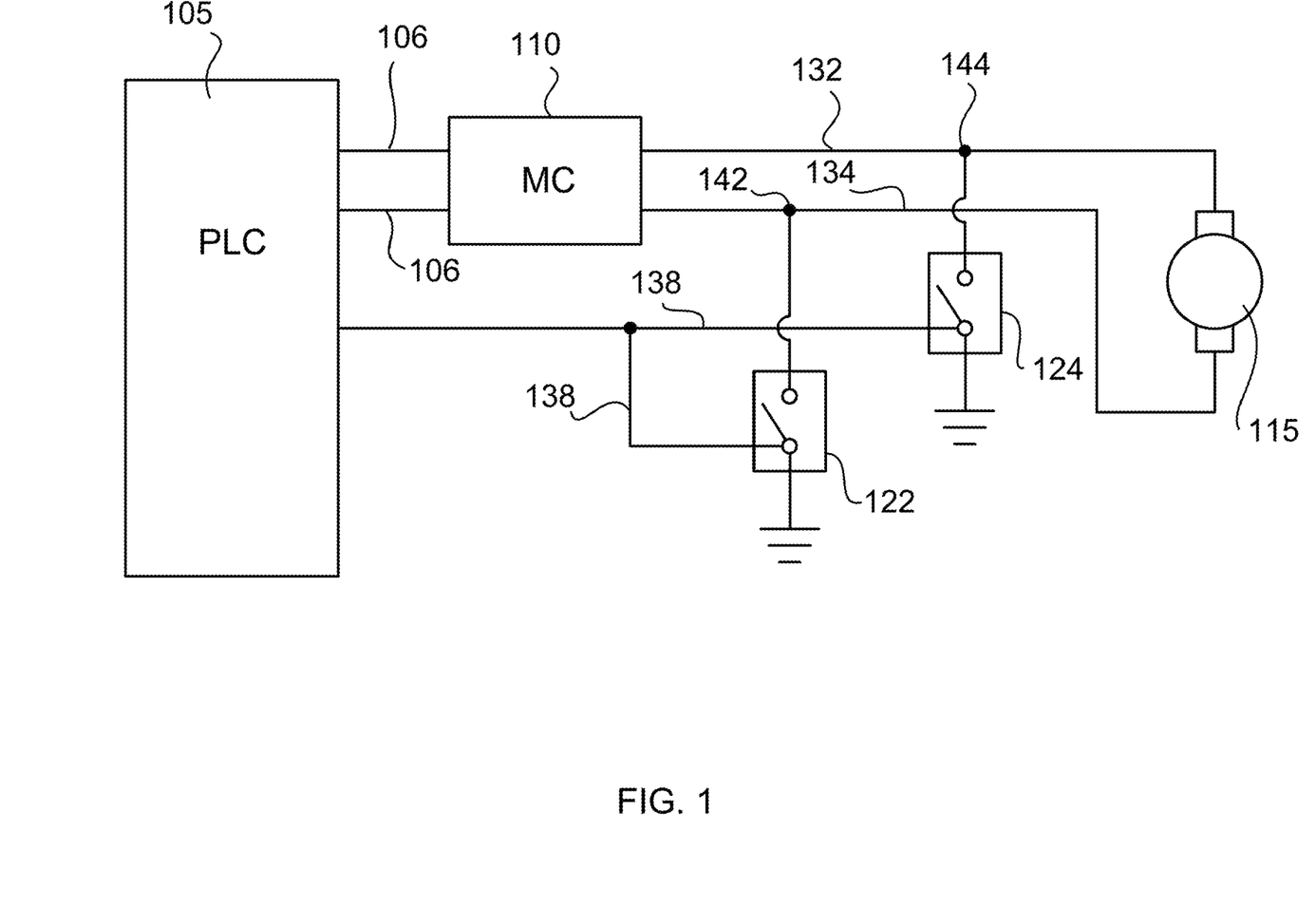
FIG. 1 is schematic diagram showing an example embodiment of the apparatus with two switches, according to an embodiment.

FIG. 1 is schematic diagram showing an example embodiment of the apparatus. In this example the control unit 105 is a programmable logic controller (PLC) which sends control signals to the motor controller 110 via wiring 106. The motor controller powers the motor 115 and controls motor shaft direction (clockwise or counterclockwise), and turns the motor 115 on or off via input wiring 132 and 134. Electronic switches 122 and 124 are connected to input wiring 132 and 134 at connections 142 and 144. Switches 122 and 124 are activated by control signals received from the PLC via control wiring 138.

Figure 2A:
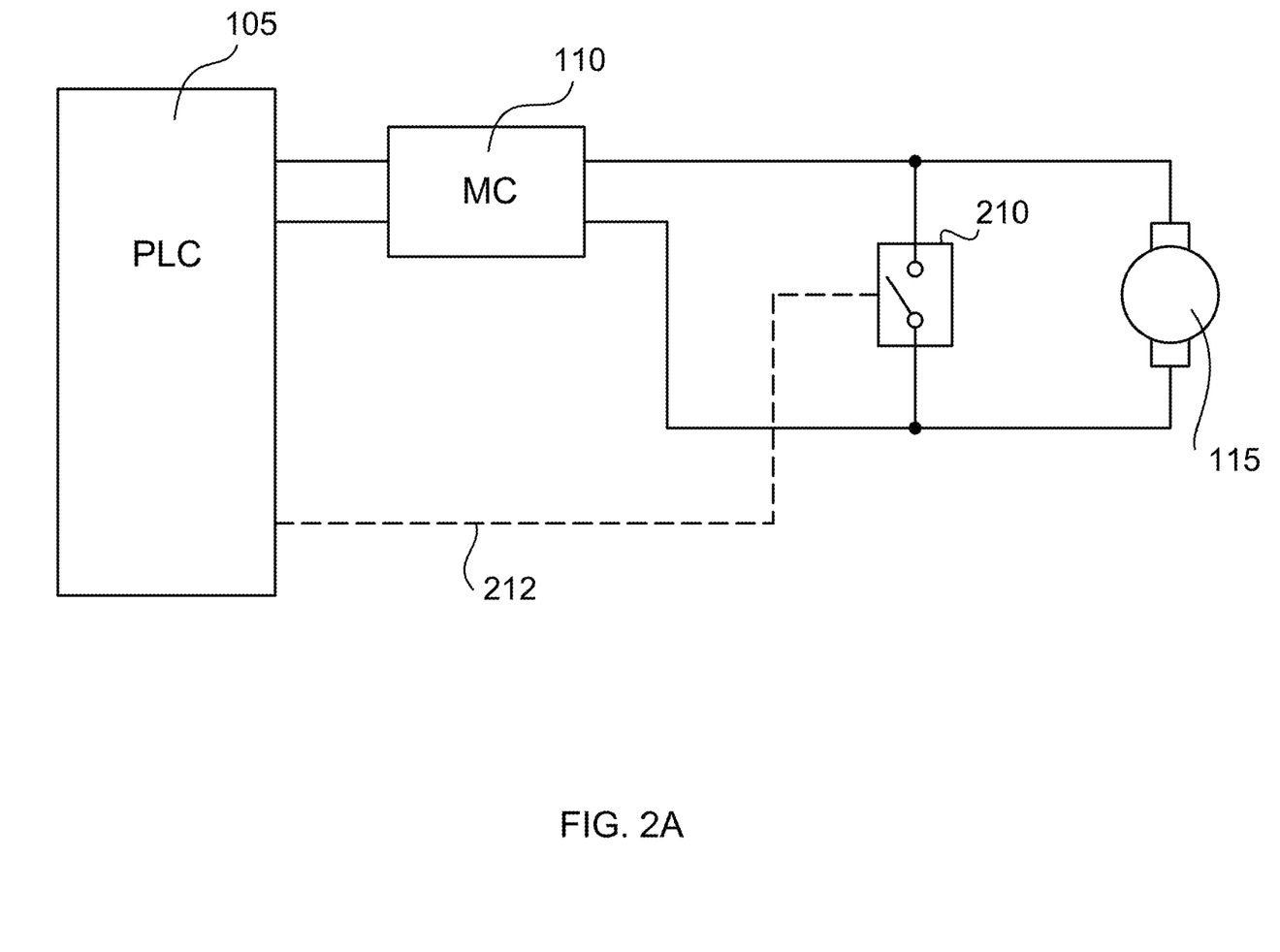
FIG. 2A is schematic diagram showing a certain example embodiment of the apparatus with one switch, according to an embodiment.

FIG. 2A is schematic diagram showing another example embodiment of the apparatus. In this example the control unit 105 is a programmable logic controller (PLC) which sends control signals to the motor controller 110. Electronic switch 210 receives a control signal from the PLC via wiring 212 to open switch 210 thus releasing the brake to motor 115.

Figure 2B:
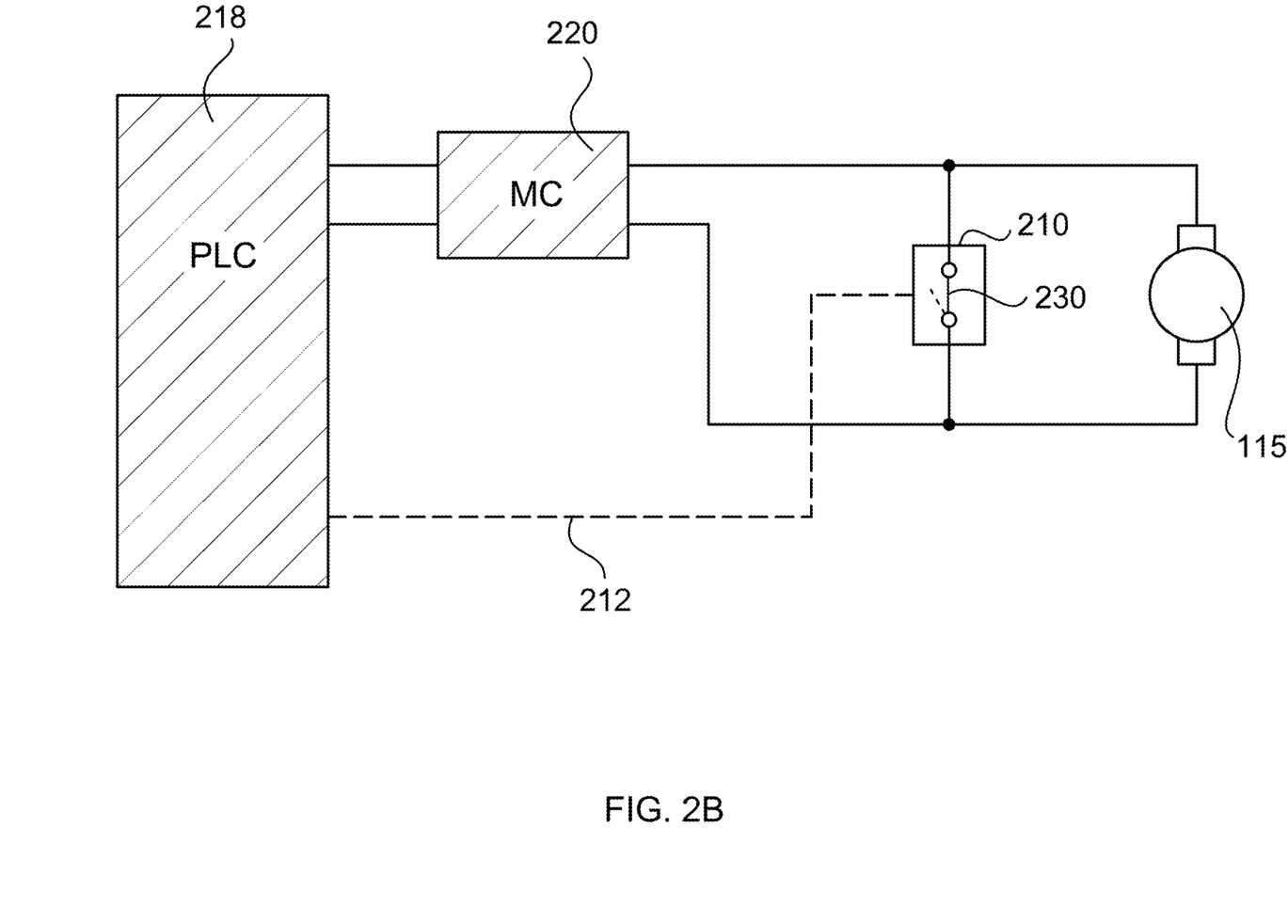
FIG. 2B is schematic diagram showing one example embodiment of the apparatus, according to an embodiment.

FIG. 2B is schematic diagram showing one example embodiment of the apparatus. In this example the control unit 218 is a programmable logic controller (PLC). The PLC 218 in this example is shaded indicating that it is in a low power state or "sleep" mode. The motor controller 110 is shaded indicating that it is "off" and does not have power to it. The PLC 218 sent a signal via control wiring 212 to switch 210 to brake the motor 115 by closing 230 the switch and making the connection. In this example, little to no power is provided to the PLC 218 and motor controller (MC) 220. Switch 210 maintains the brake during the low power state of the PLC 218 and MC 220.

Figure 3:
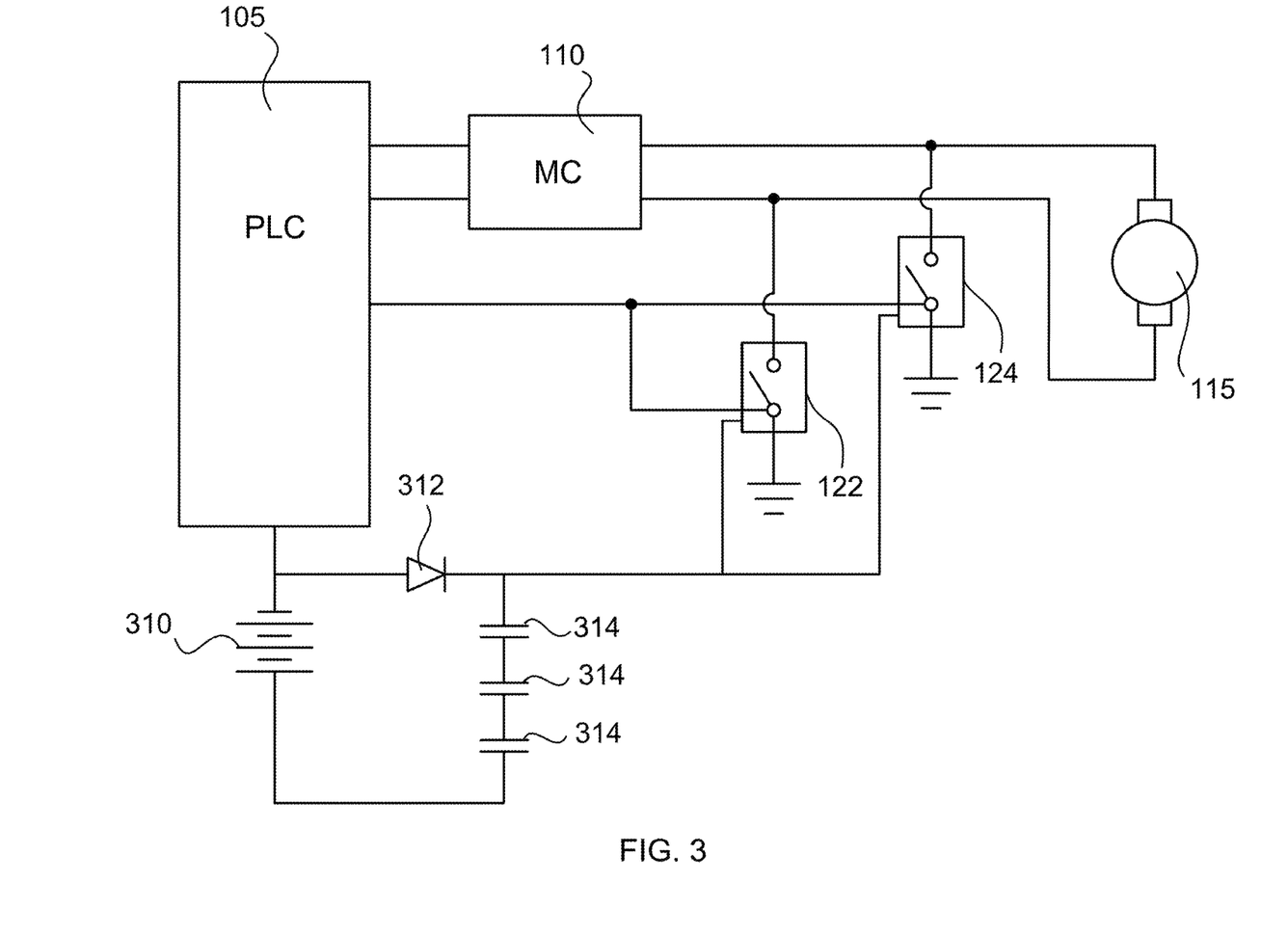
FIG. 3 is schematic diagram showing another example embodiment of the apparatus, according to an embodiment.

FIG. 3 is schematic diagram showing an example embodiment of the apparatus. In this example the control unit 105 is a programmable logic controller (PLC) which sends control signals to the motor controller 110. Switches 122 and 124 are provided power from batteries 310. The batteries 310 are the main power source to the PLC 105 and the switches 122 and 124. A second power source is shown comprising capacitors 314. These are protected from drainage from defective or depleted batteries by diode 312. The diode allows the capacitors to continue supplying power to switches 122 and 124 when the batteries 310 may be at a lower voltage.

Figure 4A:
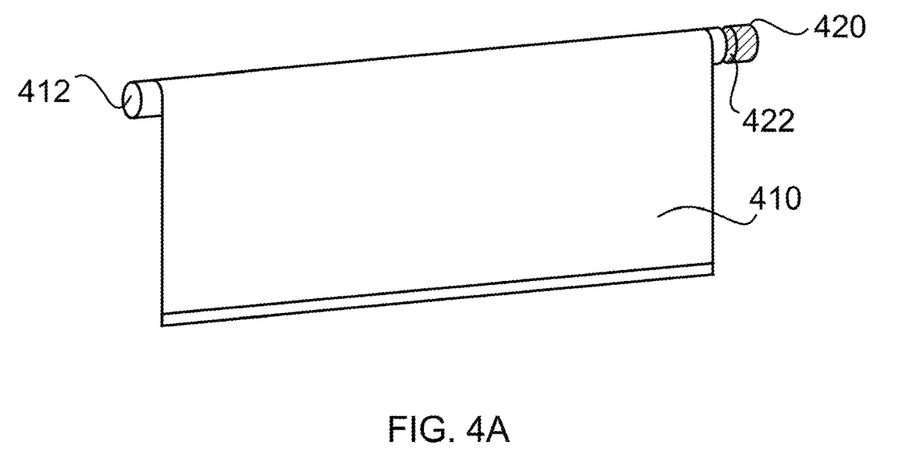
FIG. 4A is an illustration of the apparatus mechanically attached to roller shades, according to an embodiment.

FIG. 4A is an illustration of the apparatus 420 mechanically attached 422 to roller shades 440. In this example embodiment, the shade is partially open and is retained in this position by the motor brake. The roller shaft 412 is not able to rotate, maintaining the desired set point.

Figure 4B:
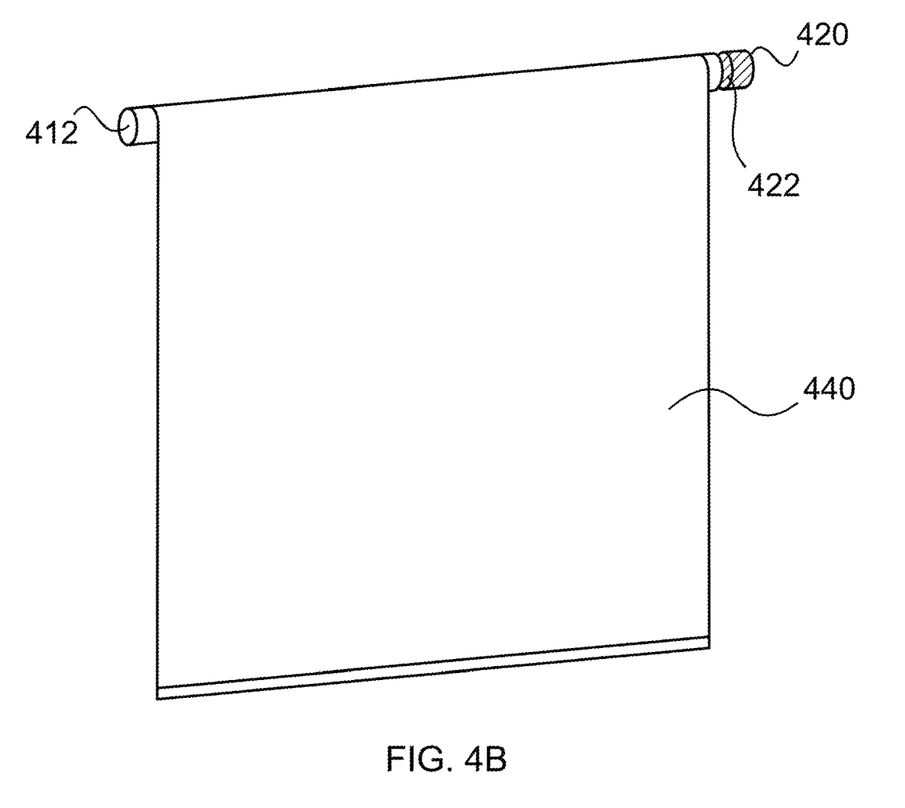
FIG. 4B is an illustration of the apparatus mechanically attached to roller shades, according to another embodiment.

FIG. 4B is an illustration of the apparatus 420 mechanically attached 422 to roller shades 440. In this example embodiment, the shade is closed and is retained in this position by the motor brake. The roller shaft 412 is not able to rotate, maintaining the desired set point.

Figure 5:
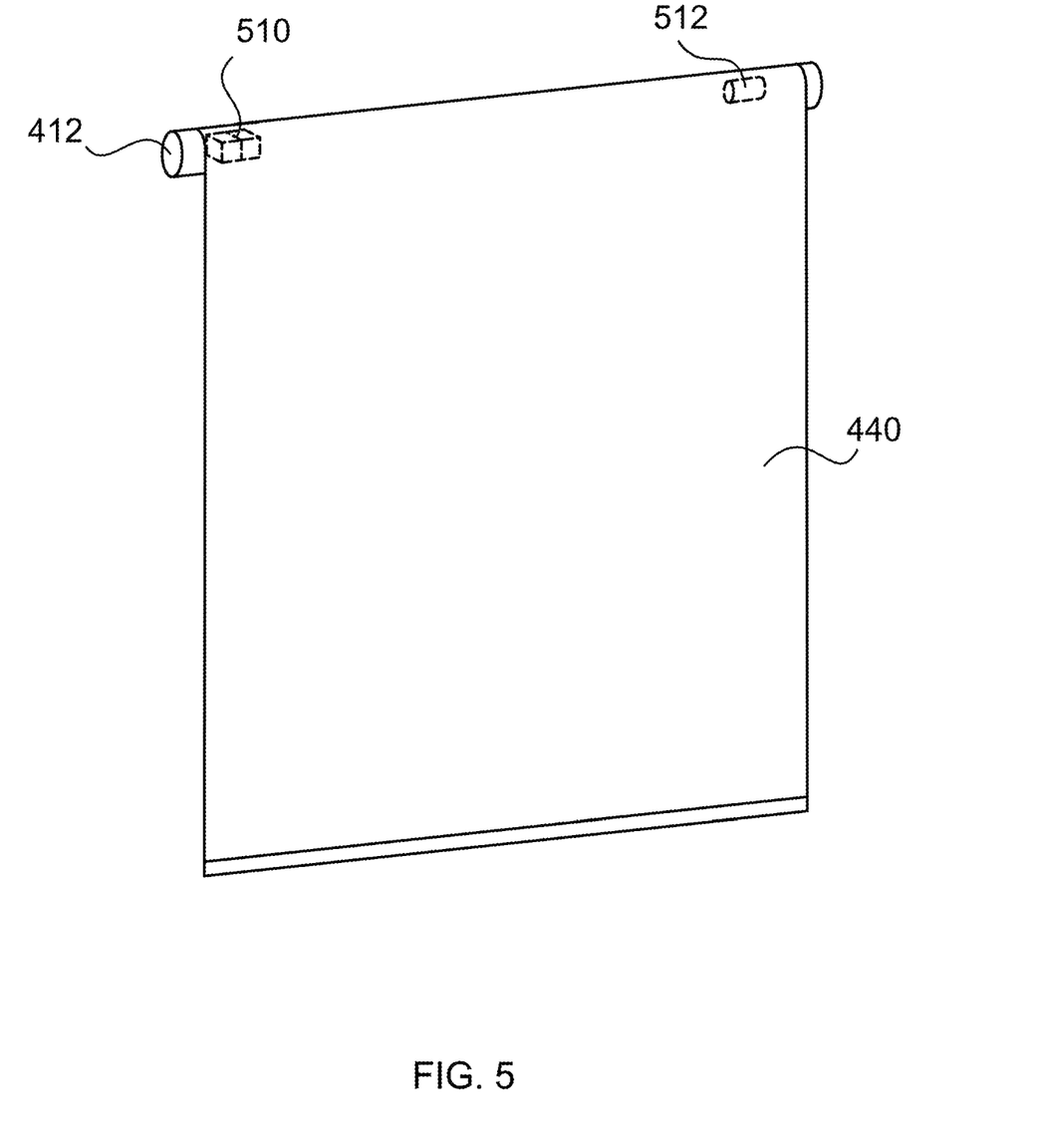
FIG. 5 is an illustration of the apparatus located inside the roller shaft of the roller shades, according to an embodiment.

FIG. 5 is an illustration of the apparatus 510 located inside the roller shaft 412 of the roller shades 440. Motor and gearbox assembly 512 may be on one side of the shaft. The roller shaft 412 is not able to rotate, maintaining the desired set point.

Figure 6:
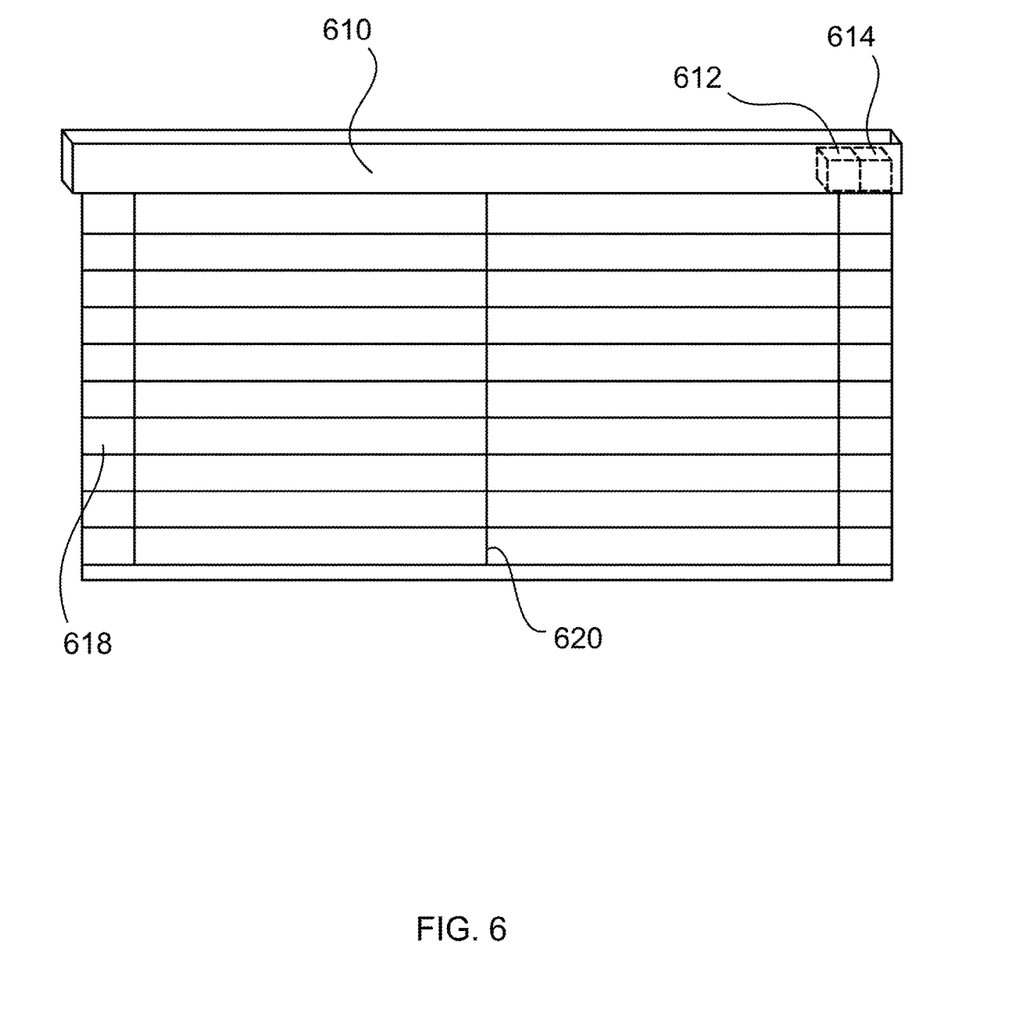
FIG. 6 is an illustration of the apparatus located inside horizontal blinds, according to an embodiment.

FIG. 6 is an illustration of the apparatus located inside horizontal blinds 618. Electronics 614 and mechanical components 612 are located in the headrail 610 of the blinds 618. The apparatus raises and lowers the blinds 618 via cords 620. Braking of the electric motor assures that the blinds remain in the closed position. In certain embodiments the window covering comprises shutters 618.

Figure 7A:
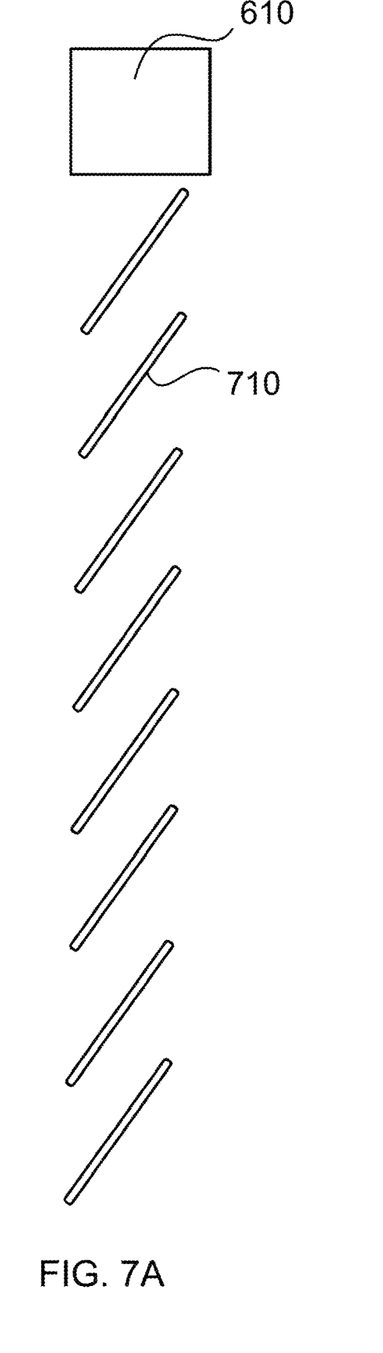
FIG. 7A is a side view of horizontal blinds in a slightly open position, according to an embodiment.

FIG. 7A is a side view of horizontal blinds 710 with headrail 610. The blinds 710, have been closed, and then creeped slightly open because of the weight of the blinds. In this example there is no motor brake, and the motor relaxed open once the blinds were closed.

Figure 7B:
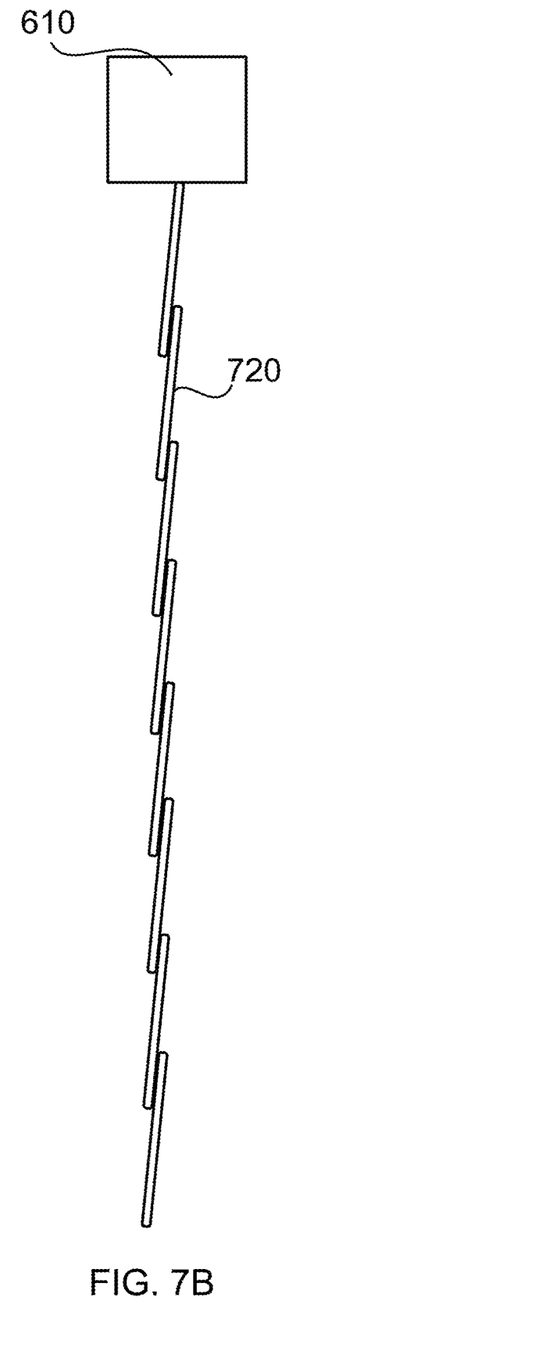
FIG. 7B is a side view of horizontal blinds in a closed position, according to an embodiment.

FIG. 7B is a side view of horizontal blinds 720 with headrail 610. The blinds 720 are completely closed in this example, and maintained in the closed position by the electric motor brake.

Figure 8:
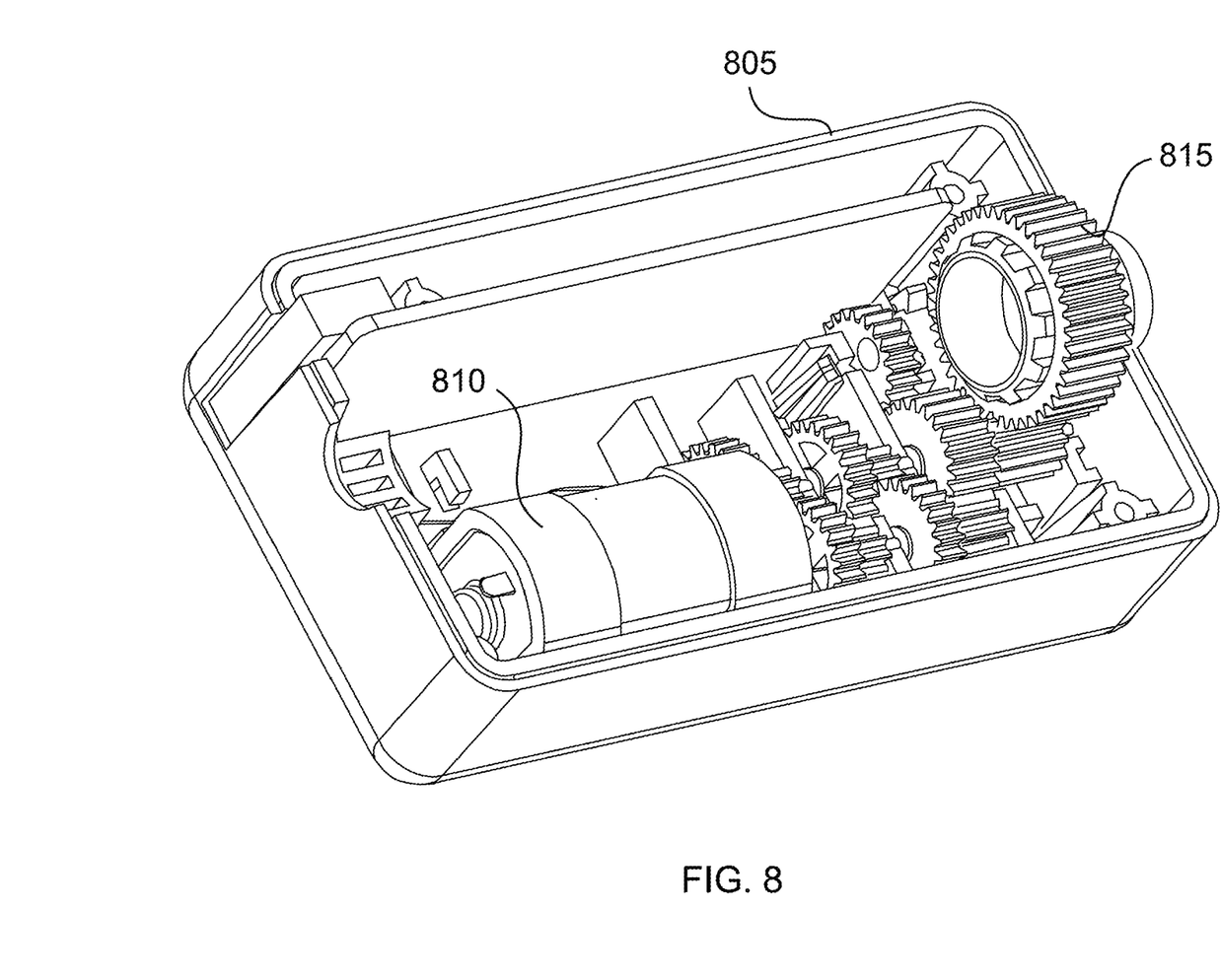
FIG. 8 is an isometric view of the gearbox assembly, according to an embodiment.

FIG. 8 is an isometric view of the gearbox assembly 805. The electric motor 810 is shown along with the window covering actuation mechanism 815. The actuating mechanism 805 raises and lowers the blinds. In another embodiment the actuating mechanism 805 rotates the slats to an open or closed position.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A window covering actuation apparatus comprising:
 a gearbox assembly configured to electromechanically operate the window covering actuation apparatus;
 a primary and a secondary power source;
 the gearbox assembly further comprising an electric motor with input wires;
 a control unit comprising a processor and memory;
 a motor controller connected to the electric motor and the control unit;
 the primary power source connected to the control unit and the motor controller;
 one or more electronic switches connected to the control unit, the motor controller, the input wires to the electric motor and the primary and secondary power source;
 the memory comprising a last switch position before the primary power source disconnects;
 wherein the control unit disconnects the primary power source to the motor controller and closes the one or more electronic switches, thus connecting the electric motor input wires together which causes the electric motor to brake in the last switch position; and
 wherein the secondary power source powers the one or more electronic switches in the closed position to maintain the brake in the last switch position while the primary power source is disconnected.

2. The apparatus of claim 1, wherein the one or more electronic switches comprise one or more of transistors, relays, FET, MOSFET, IGBT, latching relays, and bistable relays.

3. The apparatus of claim 1, wherein the electric motor is a DC motor.

4. The apparatus of claim 1, wherein the primary power source comprises batteries.

5. The apparatus of claim 1, wherein the secondary power source comprises capacitors.

6. The apparatus of claim 1, wherein the one or more electronic switches further comprise one or more capacitors as a secondary power source.

7. The apparatus of claim 6, wherein the secondary power source is protected from power drain by the power source by a diode.

8. The apparatus of claim 1, wherein the apparatus further comprises roller shades wherein the electric motor raises and lowers the shades.

9. The apparatus of claim 8, wherein the apparatus is attached to the end of the roller shades.

10. The apparatus of claim 8, wherein the apparatus is inside the roller shades' roller tube.

11. The apparatus of claim 1, wherein the apparatus further comprises window blinds of one of the following types: Persian or slat; Venetian; Roman shades; horizontal blinds, and vertical blinds.

12. The apparatus of claim 1, wherein the apparatus further comprises window shutters.

13. The apparatus of claim 1, wherein the one or more electronic switches are normally closed relays which do not require power to retain a closed position.

14. The apparatus of claim 1, wherein the one or more electronic switches comprise MOSFET transistors further comprising capacitance, thus maintaining a voltage which retains the switches in the closed position.

15. The apparatus of claim 1, wherein the one or more electronic switches maintains the brake when the control unit is in a low power mode.

16. The apparatus of claim 1, wherein the one or more electronic switches maintains the brake when the motor controller is off.

17. The apparatus of claim 1, wherein the one or more electronic switches maintain the last switch position received from the control unit prior to power loss.

18. The apparatus of claim 1, wherein the control unit is wirelessly controlled.

19. A motor brake system comprising:
 an electric motor with input wires;
 a control unit comprising a processor and memory;
 a motor controller connected to the electric motor and the control unit;
 a primary and a secondary power source connected to the control unit and the motor controller;
 one or more electronic switches connected to the control unit, the motor controller and the respective power sources;
 wherein the control unit disconnects the power source to the motor controller and closes the one or more electronic switches, thus connecting the electric motor input wires together which causes the electric motor to brake; and
 wherein the one or more electronic switches using the secondary power source maintains the brake.

20. The apparatus of claim 19, wherein the electronic switches are battery powered.

* * * * *